United States Patent
Ramabhadran et al.

(10) Patent No.: US 10,924,106 B2
(45) Date of Patent: Feb. 16, 2021

(54) MILLER TRANSITION CONTROL GATE DRIVE CIRCUIT

(71) Applicant: General Electric Company, Schenectady, NY (US)

(72) Inventors: Ramanujam Ramabhadran, Schenectady, NY (US); Krishna Mainali, Schenectady, NY (US); Kum-Kang Huh, Schenectady, NY (US); Maja Harfman-Todorovic, Niskayuna, NY (US); Robert James Thomas, Clifton Park, NY (US); Cong Li, Schenectady, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 16/238,348

(22) Filed: Jan. 2, 2019

(65) Prior Publication Data

US 2020/0212909 A1    Jul. 2, 2020

(51) Int. Cl.
*H03K 3/00* (2006.01)
*H03K 17/16* (2006.01)
*H02M 1/08* (2006.01)
*H03K 17/042* (2006.01)
*H02M 1/00* (2006.01)

(52) U.S. Cl.
CPC ............ *H03K 17/165* (2013.01); *H02M 1/08* (2013.01); *H03K 17/04206* (2013.01); *H02M 2001/0054* (2013.01)

(58) Field of Classification Search
CPC . H03K 17/165; H03K 17/04206; H02M 1/08; H02M 2001/0054

USPC .......................................................... 327/109
See application file for complete search history.

(56) References Cited

U.S. PATENT DOCUMENTS

| | | | |
|---|---|---|---|
| 5,373,435 A * | 12/1994 | Jayaraman | H02M 7/538 363/98 |
| 6,992,520 B1 | 1/2006 | Herbert | |
| 7,195,979 B2 | 3/2007 | Elbanhawy | |
| 8,847,631 B2 * | 9/2014 | Tao | H03K 17/04123 327/108 |
| 2008/0012610 A1 * | 1/2008 | Aoki | H01L 27/0255 327/109 |
| 2010/0295476 A1 * | 11/2010 | Franco | G05F 1/561 315/297 |
| 2018/0150093 A1 * | 5/2018 | Poletto | H03K 17/687 |
| 2019/0068045 A1 * | 2/2019 | Ramabhadran | H02M 1/32 |

(Continued)

OTHER PUBLICATIONS

Musumeci, "Gate charge control of high-voltage Silicon-Carbide (SiC) MOSFET in power converter applications", 2015 International Conference on Clean Electrical Power (ICCEP), Taormina, Italy, 2015.

(Continued)

*Primary Examiner* — Ryan Jager
(74) *Attorney, Agent, or Firm* — Fletcher Yoder, P.C.

(57) ABSTRACT

Aspects of the present disclosure are directed toward designs and methods of improving driving of switching devices. One proposed solution to improving driving of switching devices is an auxiliary control circuit that selectively guides the switching device through at least one switching region, permitting an improved operation of the switching device.

22 Claims, 11 Drawing Sheets

(56) References Cited

U.S. PATENT DOCUMENTS

2019/0181854 A1* 6/2019 Shimomura ........... H03K 17/04

OTHER PUBLICATIONS

Vrtovec et al., "Advanced gate control system for power MOSFET switching losses reduction with complete switching sequence control", Journal of Microelectronics, Electronic Components and Materials, vol. 46, Issue: 4, pp. 238-249, 2016.

* cited by examiner

Very rapid turn-on Eon=11uJ

MILLER TRANSITION CONTROL GATE DRIVE CIRCUIT

TECHNICAL FIELD

The subject matter disclosed herein relates to techniques for improving driving of metal-oxide-semiconductor field-effect transistor (MOSFET) devices and other suitable switching devices.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In electronic systems, power semiconductor device, or power semiconductor switching devices, such as MOSFET devices, insulated-gate bipolar transistors (IGBTs), bipolar transistors (BJTs), or the like are leveraged to selectively couple one or more components of the electronic systems in response to a control signal. As new developments affect these electronic systems, the switching devices, are expected to switch at an increased rate (e.g., faster, more responsive). For example, MOSFET devices used in electronic systems are expected to switch quickly with minimal switching losses. However, power semiconductor device switching is complicated and is difficult to perform quickly since too fast of a turn-on for some of the power semiconductor devices may lead to electro-magnetic interferences in the electronic systems and undesired losses.

BRIEF DESCRIPTION

Certain embodiments commensurate in scope with the originally claimed disclosure are summarized below. These embodiments are not intended to limit the scope of the claimed disclosure, but rather these embodiments are intended only to provide a brief summary of possible forms of the disclosure. Indeed, embodiments may encompass a variety of forms that may be similar to or different from the embodiments set forth below.

In one embodiment, a circuit may include a first switching device coupled to a load and a first voltage source that generates an electrical signal at a voltage level at least equal to a threshold voltage of the first switching device. The circuit may also include a second switching device between the first switching device and the first voltage source. The second switching device may provide a shaped current to the first switching device in response to a control signal. The shaped current may be generated based at least in part on the electrical signal generated by the first voltage source. The shaped current actuates the first switching device.

In another embodiment, a power converter system may include a load that operates based at least in part on a supplied electrical signal. The power converter system also may include a switching network that selectively enables and disables the supplied electrical signal based at least in part on a control scheme associated with operation of the load. The switching network may include a gate driver and a power device. The power device may enable in response to a control signal generated by the gate driver based on the control scheme. Enabling of the power device may selectively enable and disable the supplied electrical signal. The switching network may include an auxiliary control circuit between the gate driver and the power device. The auxiliary control circuit may shape the control signal before the control signal is applied to the power device.

In yet another embodiment, an auxiliary control circuit may include a first switching device that enables in response to a control signal generated to control supply of a shaped current to a second switching device. The auxiliary control circuit may also include a first voltage source that generates the control signal. The control signal may include an electrical signal having a voltage level at least equal to a threshold voltage of the first switching device. The auxiliary control circuit may also include one or more devices between the first switching device and a second voltage source. The first switching device may provide the shaped current to the second switching device in response to being enabled by the control signal. The shaped current may be generated based at least in part on the electrical signal generated by second voltage source and an impedance value of the one or more devices. The shaped current may actuate the first switching device.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
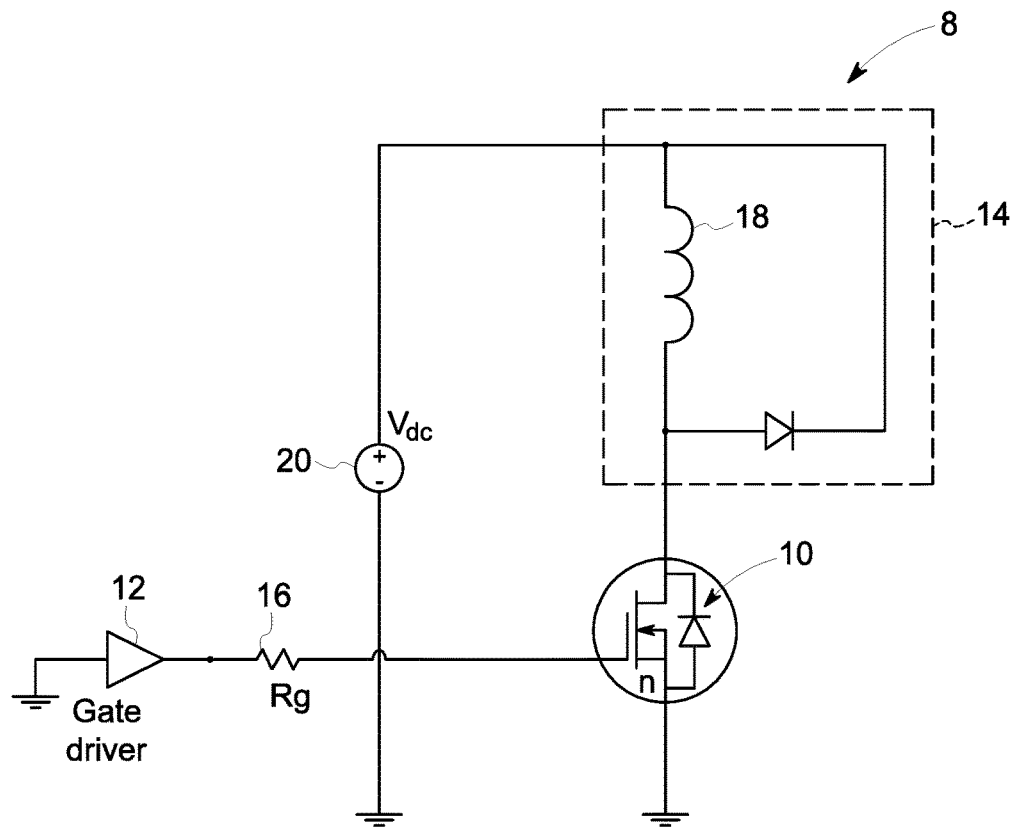
FIG. 1 is a circuit diagram of a metal-oxide-semiconductor field-effect transistor (MOSFET) device and a driver circuit, in accordance with aspects of the present approach.

One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Technological innovation has led to an increasing demand for transistors, and other switching devices, with faster and/or otherwise improved switching capabilities. For example, when a transistor switches too fast, ringing from excitement of parasitics associated with the transistor may be introduced into the output, while when a transistor switches too slow, ringing may be reduced but overall losses increase due at least in part to losses from operating the transistor in a lossy operational region, such as in the Miller region. This ringing may decrease performance of the transistor, for example, by also increasing electro-magnetic losses associated with the switching. In other words, it is no longer sufficient for a transistor to switch relatively fast without also compensating for parasitic responses and ringing caused by the switching.

An auxiliary control circuit may facilitate reducing switching losses associated with switching a power semiconductor device (e.g., open, close), such as losses from intrinsic parasitics (e.g., parasitic capacitances) storing and dissipating energy during switching transitions of the MOSFET device. Examples of power semiconductor devices may include metal oxide semiconductor field effect transistors (MOSFET) devices, insulated-gate bipolar transistors (IGBTs), bipolar transistors (BJTs), or the like. The auxiliary control circuit selectively guides the semiconductor power device through its various switching regions, reducing losses and permitting precise driving of the semiconductor power device. In this way, the auxiliary control circuit may operate to reverse a charge quickly, such as a charge on a Miller capacitance (e.g., gate-drain parasitic capacitance) associated with the semiconductor power device, to reduce time spent by the semiconductor power device in the Miller plateau, therefore reducing switching losses. Furthermore, coupling multiple auxiliary control circuits in parallel may increase control over semiconductor power device switching. For example, the various auxiliary control circuits may each be designed to each cause a MOSFET device to operate in different switching regions, such as by modulating impedance values between respective auxiliary control circuits to facilitate providing an ideal resistance value at the various switching regions of the MOSFET device. The various auxiliary control circuits may respectively receive different control voltages at different times based on when a semiconductor power device is to be operated into its various switching regions (e.g., where presumably one auxiliary control circuit is designed to facilitate switching of the semiconductor power device into a first switching region which is different from a second auxiliary control circuit designed for a second switching region different from the first switching region). Respective selection of each auxiliary control circuit may facilitate fast and controlled switching suited to the particular switching regions and switching characteristics of the semiconductor power device since, at least, the impedance values may be selectively changed between the semiconductor power device entering various switching regions by activating different auxiliary control circuits at different times during the semiconductor power device switching.

By way of introduction, FIG. 1 is a circuit diagram of an example circuit 8 including a MOSFET device 10. To simplify explanation, embodiments involving a MOSFET device as the semiconductor power device described above are included herein as examples of a suitable practical implementation. This should not be interpreted as a limiting embodiment, since as previously described, the techniques described herein may improve driving techniques for any semiconductor power device having different operational regions, such as a switching region associated with a Miller threshold as is discussed below with respect to FIG. 2. The MOSFET device 10 may be used in variety of applications wherever a switching component is to be used. For example, the MOSFET device 10 may be used in AC motor drives, adjustable-speed AC motor drives, certain power supplies, battery applications, or the like. Similarly, a gate driver 12 (e.g., a gate driver circuit) may output a gate voltage to a gate of the MOSFET device 10. The gate voltage may be used to operate the MOSFET device 10 into one or more operational regions. The gate driver 12 may be (or may be included in) a variety of devices, such as a gate driver, pulse width modulation (PWM) controller, or any suitable voltage source. It should be noted that the gate driver 12 may output a voltage value with respect to a ground voltage (e.g., depicted via the ground symbol on FIG. 1 and in subsequent figures) or with respect to a common reference voltage, effectively coupling these various nodes to the same voltage. As will be appreciated, the gate driver 12 may be supplied a driving signal, such as a current, from a supply circuit as part of a system-level implementation of the MOSFET device 10 and/or other power devices in a switching network.

The circuit 8 also includes a resistor 16 having a resistance value. When the resistor 16 has a relatively large gate resistance value, switching losses may increase as well as a total time of switching, but reduce ringing associated with switching. Alternatively, when the resistor 16 has a relatively small gate resistance value, switching losses may reduce, a total time of switching may reduce, but ringing associated with switching may increase. Thus, typical operation uses a resistance value that balances benefits from the decreased switching speed and switching losses with the increases in the ringing associated with switching. The circuit 8 also includes a load inductance model 14. The load inductance model 14 represents a load of the MOSFET device 10 which is affected by the MOSFET device 10 actually conducting electricity (e.g., from the source terminal to drain terminal). In some embodiments, however, the load inductance model 14 may include representation of other switching currents that may be directed into and/or away from the MOSFET device 10. Upon activation of the MOSFET device 10 (e.g., turn-on), a load inductance 18 may receive a supply voltage from voltage source 20.

To complete switching of the MOSFET device 10, the gate driver 12 applies the gate voltage to switch (e.g., turn-on a normally-off device, turn-off a normally on device) the MOSFET device 10. To simplify discussion, the MOSFET device 10, and each MOSFET device of this disclosure, may be considered a normally-off device that is switched to a turned-on state to make an electrical coupling between a drain terminal and a source terminal. During a typical switching operation, the gate voltage is varied by the gate driver 12 to drive the MOSFET device 10 through different operational regions. The MOSFET device 10 has material parameters (e.g., parasitic capacitances) that change requirements for switching of the MOSFET device 10 to occur, such as a threshold voltage, one or more voltages used during switching, or the like. In this way, the gate driver 12 may transmit different voltage levels to the MOSFET device 10 at different times to complete switching operations.

Figure 2A:
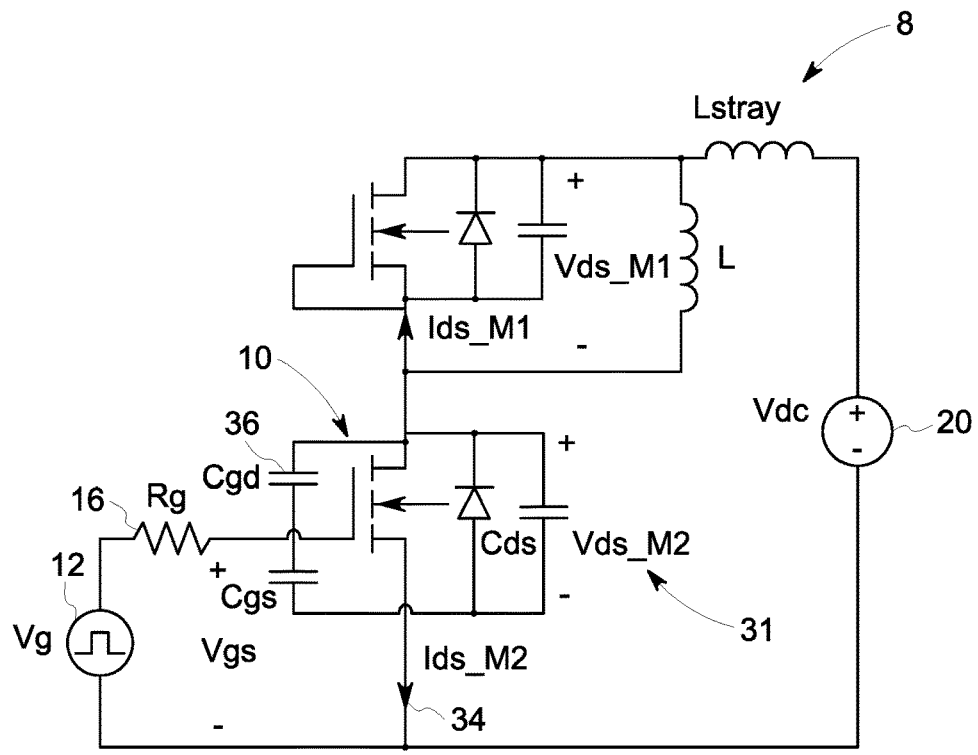
FIG. 2A is a circuit design of another example of a MOSFET device and the driver circuit of FIG. 1, in accordance with aspects of the present approach.
Figure 2B:
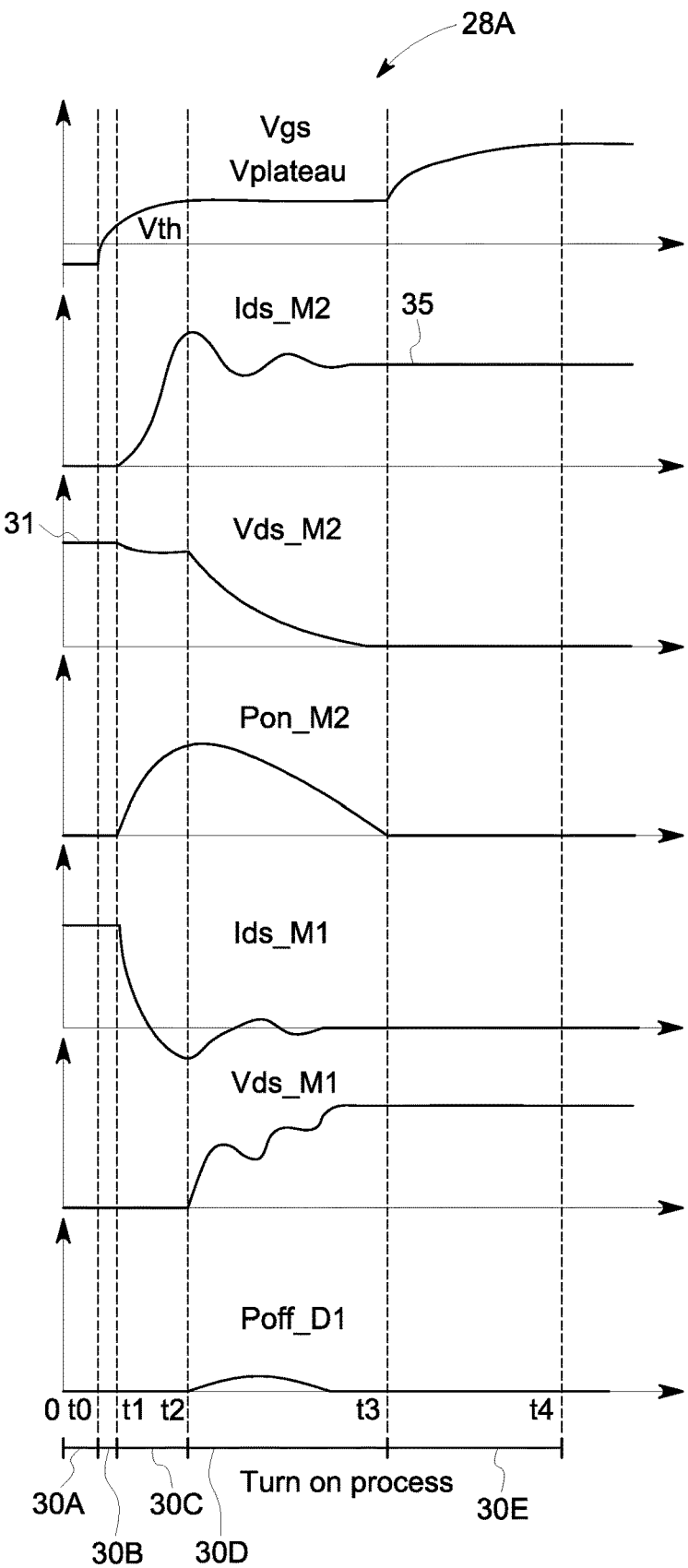
FIG. 2B is a graph depicting operational regions associated with turning-on the MOSFET device of FIG. 2A, in accordance with aspects of the present approach.
Figure 2C:
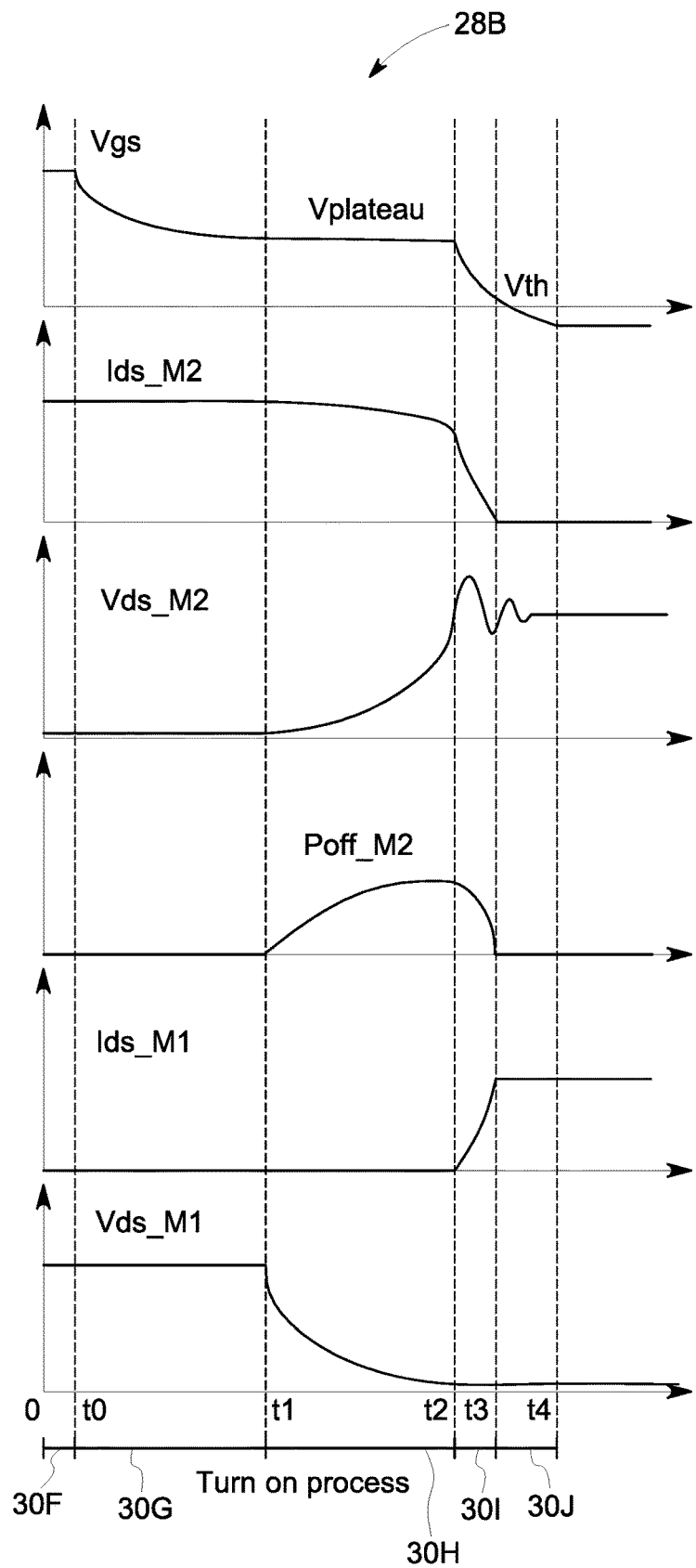
FIG. 2C is a graph depicting operational regions associated with turning-off the MOSFET device of FIG. 2A, in accordance with aspects of the present approach.

FIG. 2A is a circuit diagram of an example MOSFET device 10 coupled to a load 8 with various outputs and signals labelled to correspond to FIG. 2B and FIG. 2C. FIG. 2B is a graph 28A depicting electrical waveforms of the MOSFET device 10 present during turn-on operations (e.g., the MOSFET device 10 of FIG. 2A switching-on or being activated). FIG. 2C is a graph 28B depicting electrical waveforms of the MOSFET device 10 present during turn-off operations (e.g., the MOSFET device 10 of FIG. 2A switching-off or being deactivated). For ease of discussion, FIG. 2A, FIG. 2B, and FIG. 2C are discussed together herein. Pictured are various regions 30 (e.g., 30A, 30B, 30C, 30D, 30E) that may have different electrical characteristics as the MOSFET device 10 is turned-on. Region 30A may correspond to an operational state before the device meets a turn-on threshold. Electrical signals may be applied to the gate of the MOSFET device 10 until the gate-source voltage of the MOSFET device 10 reaches the turn-on threshold. At the turn-on threshold of the MOSFET device 10 begins switching through region 30B and region 30C onto region 30D corresponding to a Miller threshold while drain voltage (e.g., voltage 31, line 33) of the MOSFET device 10 decreases. While in the region 30D, the gate-source voltage of MOSFET device 10 may behave generally linearly in response to the electrical signals while current through the MOSFET device 10 (e.g., current 34, line 35) fully reverses over an effective capacitance (e.g., a Miller capacitance 36) disposed between the drain terminal and the gate terminal of the MOSFET device 10 caused at least in part by an increase in carriers associated with the MOSFET device 10 conduction. Once reversal happens, the next region 30E is entered and the MOSFET device 10 may be completely turned-on.

While in the region 30D, the output of the MOSFET device 10 may correspond at least in part to a Miller plateau. The Miller plateau may be a result of the effective capacitance (e.g., the Miller capacitance 36) between the drain and the gate of the MOSFET device 10. The increase in carriers may cause the gate-to-drain capacitance to increase, causing the Miller plateau from the constant electrical signal input to the gate of MOSFET device 10.

As is depicted in FIG. 2C, the MOSFET device 10 may also undergo a turn-off process that is subject to similar thresholds and Miller plateau that the turn-on process undergoes. For example, region 30H of the graph 28B may be similar to the Miller plateau region associated with the region 30D of the graph 28A. Furthermore, the region 30I and the region 30J show switching characteristics of the MOSFET device 10 as electrical signals through the MOSFET device 10 decrease in accordance with the threshold voltage, similar but inverse to the switching characteristics depicted in the region 30A, the region 30B, and the region 30C. The electrical characteristics depicted by the graph 28B in the region 30F may correspond to the stabilized electrical characteristics depicted by the graph 28A at the boundary of the region 30E after turn-on occurred.

It is generally understood that some of the switching losses of the MOSFET device 10 (e.g., turning-on or turning-off) arise from operating the MOSFET device 10 in the region 30D and the region 30H, that is, in the Miller plateau region. To reduce these losses, the MOSFET device 10 may be switched (e.g., turned-on) relatively fast. However, a fast switching operation may excite parasitic impedances (e.g., parasitic inductances, parasitic capacitances) associated with the MOSFET device 10. The excited parasitic impedances cause undesirable losses and ringing in the electrical signals associated with the MOSFET device 10 (e.g., ringing depicted with the line 35 representing the current 34). Thus, coupling a controllable auxiliary control circuit to the MOSFET device 10 to drive the MOSFET device 10 to enter and/or exit these various operational regions may be useful and/or desired. Furthermore, the auxiliary control circuit may also be able to reverse a charge of the Miller capacitance while also modulating the gate resistance to facilitate decreasing ringing and other undesired effects from excitation of the parasitic impedances. Embodiments of the present disclosure relate at least in part to circuits, systems, and methods for providing the above-described auxiliary control circuit.

Figure 3:
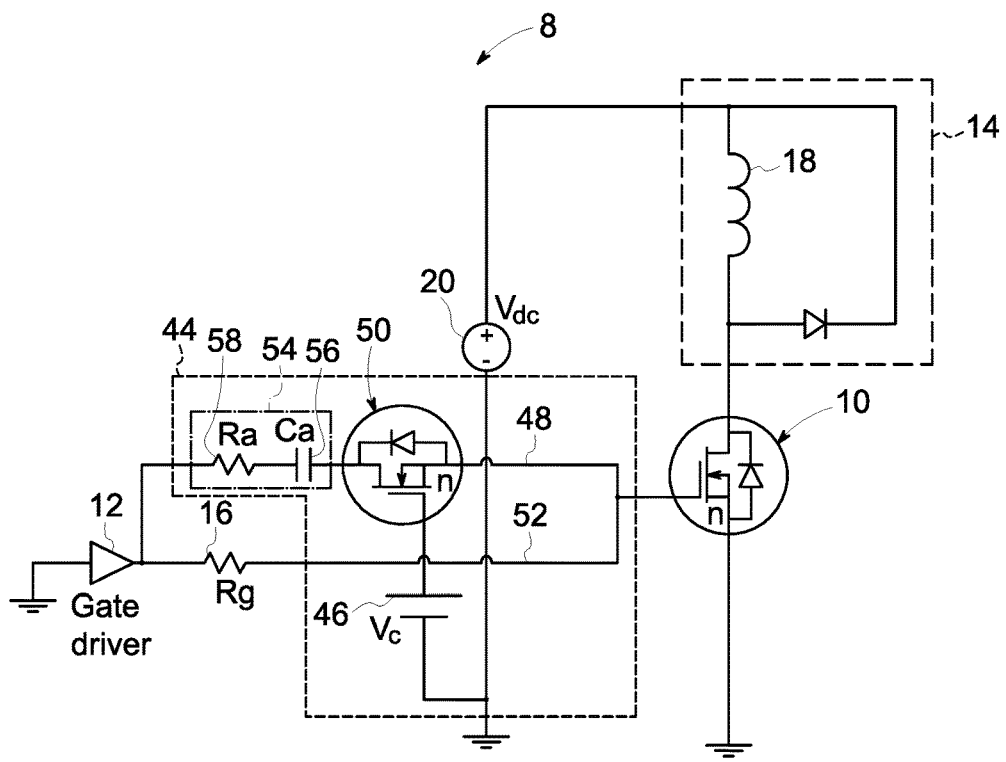
FIG. 3 is a circuit diagram of the MOSFET device of FIG. 1, the driver circuit of FIG. 1, and an auxiliary control circuit, in accordance with aspects of the present approach.

FIG. 3 shows the circuit 8 of FIG. 1 including an auxiliary control circuit 44 configured to operate the MOSFET device 10 into one or more operational regions. As depicted, the auxiliary control circuit 44 is an analog circuit used operate the MOSFET device 10 into one or more operational regions, for example, by injecting additional current (e.g., boost current) that has been shaped or specifically parameterized (e.g., current shaping and/or timing control) to facilitate operating the MOSFET device 10 beyond the Miller plateau 32, or other suitable operation. It should be understood that shaping or current shaping herein refers to intentional adjustment of timing, amplitude, shape, or the like of a current pulse supplied from the auxiliary control circuit 44 to the MOSFET device 10. In some embodiments, the shaped current pulse (e.g., the current pulse supplied from the auxiliary control circuit 44) may be provided as a boost current to supplement, adjust, change, or otherwise affect a main driving signal provided to the MOSFET device 10. FIG. 3 depicts an embodiment that provides the shaped current pulse as a boost current while FIG. 10, for example, depicts an embodiment that provides the shaped current pulse as a driving current, as is discussed below. Although not specifically depicted, it should be understood that one or more portions of the auxiliary control circuit 44, including any control circuitry associated with the auxiliary control circuit 44 (e.g., circuitry used to generate a gate voltage from voltage source 46, supporting circuitry that incorporates the auxiliary control circuit 44 into a feedback loop), may include at least in part one or more digital circuitry components.

The auxiliary control circuit 44 includes an auxiliary path 48 to facilitate transitioning the MOSFET device 10 between the on and off states. Although the auxiliary control circuit 44 is depicted as including one switch device (e.g., second MOSFET device 50), it should be understood that a variety of switches and/or any suitable number of switches may be used to operate the MOSFET device 10 into the one or more operational regions. For example, a variety of suitable switching devices may be used in addition to or alternative of the MOSFET device 50, including but not limited to current-controlled switches, voltage-controlled switches, suitable semiconductor power devices, or the like. Furthermore, although depicted as one or more inductors, it should be understood that parasitics of the circuit 8 may be modeled as a variety of suitable components. The auxiliary control circuit 44 may be used to control operation of the MOSFET device 10 via changing the impedance of the auxiliary control circuit 44.

The auxiliary control circuit 44 includes the MOSFET device 50 and the voltage source 46 to generate a control voltage associated with enabling the auxiliary path 48. The MOSFET device 10 is operated in its different regions (e.g., linear, fully-on) during switching. The auxiliary control circuit 44 couples through the MOSFET device 50 to a main driving path 52 coupled to the gate of the MOSFET device 10. The MOSFET device 50 is in series with a time element—in particular, a resistor-capacitor (RC) circuit 54.

The time element may be any suitable component(s) that permits the MOSFET device 50 to be programmed to be turned-on for a particular time period. The RC circuit 54 may be programmed to provide a boost current for a particular time duration based on the capacitance value of capacitor 56 and the resistance value of resistor 58. For example, the RC circuit 54 is designed to have a specific time constant, such that the RC circuit 54 outputs a boost current for a predetermined, programmed, or other preset duration of time based at least in part on the time constant. The resistance value of the resistor 58 and/or the capacitance value of the capacitor 56 may be selected at least in part to define a particular amount of current transmitted for the duration of time specified by the time constant. In this manner described, the auxiliary control circuit 44 may be used to control operation of the MOSFET device 10 via changing the impedance of the auxiliary control circuit 44.

To generally explain operation of the circuit 8 as depicted in FIG. 3, the MOSFET device 10 receives a gate voltage from the gate driver 12. A control voltage from the voltage source 46 is used to bias the MOSFET device 50 to operate the MOSFET device 50 to turn-on and/or turn-off. The control voltage may be active (e.g., have a high voltage) for a duration of time, and after the duration of time passes, the control voltage may be inactive (e.g., have a low voltage, have a ground voltage level). In some embodiments, the control voltage may be a constant output from a voltage source 46 and an additional switch may be used to modulate application of the control voltage to the MOSFET device 50.

Initially, the MOSFET device 50 is operated to be turned-on. While the MOSFET device 50 is turned-on, the capacitor 56 and the resistor 58 affect the boost current provided to the main driving path 52. The RC circuit 54 provides a boost current to the main driving path 52 of the MOSFET device 10 until a sufficiently long time passes and the capacitor finishes charging. The value of the resistor 58 and the capacitor 56 are selected to define a particular time constant for the output boost current. The time constant facilitates setting a conduction duration (e.g., how long the boost current is non-zero and therefore a duration of time the current boosts the MOSFET device 10 for) of the current while the resistance value of the resistor 58 and/or capacitance value of the capacitor 56 facilitate setting the value of the current transmitted as a gate control signal to the MOSFET device 10.

During operation, as the gate-source voltage increases of the MOSFET device 10, the MOSFET device 50 may be operated to turn-off. When the capacitor 56 and the resistor 58 are suitably sized, the current through the auxiliary branch may decrease to negligible (e.g., die down, attenuate) before the MOSFET device 50 is operated to turn off. In some embodiments, the resistor 58 has a resistance value less than the resistance value of the resistor 16, permitting a rapid turn-on of the MOSFET device 10 just past the Miller plateau 32. While the capacitor 56 charges, a boost current based at least in part on charging of the capacitor 56 is provided to a gate voltage supplied to the MOSFET device 10 from the gate driver 12. The boost current facilitates transitioning the MOSFET device 10 into a particular operational region until the capacitor 56 has the time to charge to its saturation level, thereby opening the circuit and permitting the boost current to halt affecting the driving of the MOSFET device 10. As may be appreciated, the auxiliary control circuit 44 may be coupled in parallel with one or more additional auxiliary control circuits, such that each of the auxiliary control circuits (e.g., auxiliary control circuit 44) is operable to activate at a particular time and are able to generate different boost currents based on which operational region each auxiliary control circuit 44 is to operate the MOSFET device 10. It is noted that the components of each auxiliary control circuit 44 may correspond to the operational region that the MOSFET device 10 is to be operated into. In this way, the selection of the impedances value (e.g., the selection of specific resistance and/or capacitance values) of the auxiliary control circuit 44 may be based at least in part on electrical parameters associated with the operational region, for example, voltage levels and/or thresholds associated with the different operational regions of the MOSFET device 10.

The auxiliary control circuit 44 may be thought of as a knob. In this way, similar to a knob, the boost current that is output by the auxiliary control circuit 44 and applied to the gate of the MOSFET device 10 is programmable based on the combination of impedances within the auxiliary control circuit 44. Thus, the auxiliary control circuit 44 may be programmed to compensate for a parasitic response associated with material parasitics of the circuit 8, permitting ringing caused by the fast switching to decrease. Since the auxiliary control circuit 44 time constant is programmable through changing resistances and/or capacitance values added into the auxiliary control circuit 44, the auxiliary control circuit 44 may be used to drive the MOSFET device 10 in a predetermined manner during each switching operation. By leveraging preprogrammed auxiliary control circuits (e.g., auxiliary control circuit 44) to drive the MOSFET device 10, precise switching operations may be permitted relative to current driving techniques used to drive MOSFET devices (e.g., MOSFET device 10). Furthermore, the auxiliary control circuits may enable faster switching of the MOSFET devices (e.g., MOSFET device 10) relative to the current driving techniques described above.

Figure 4A:
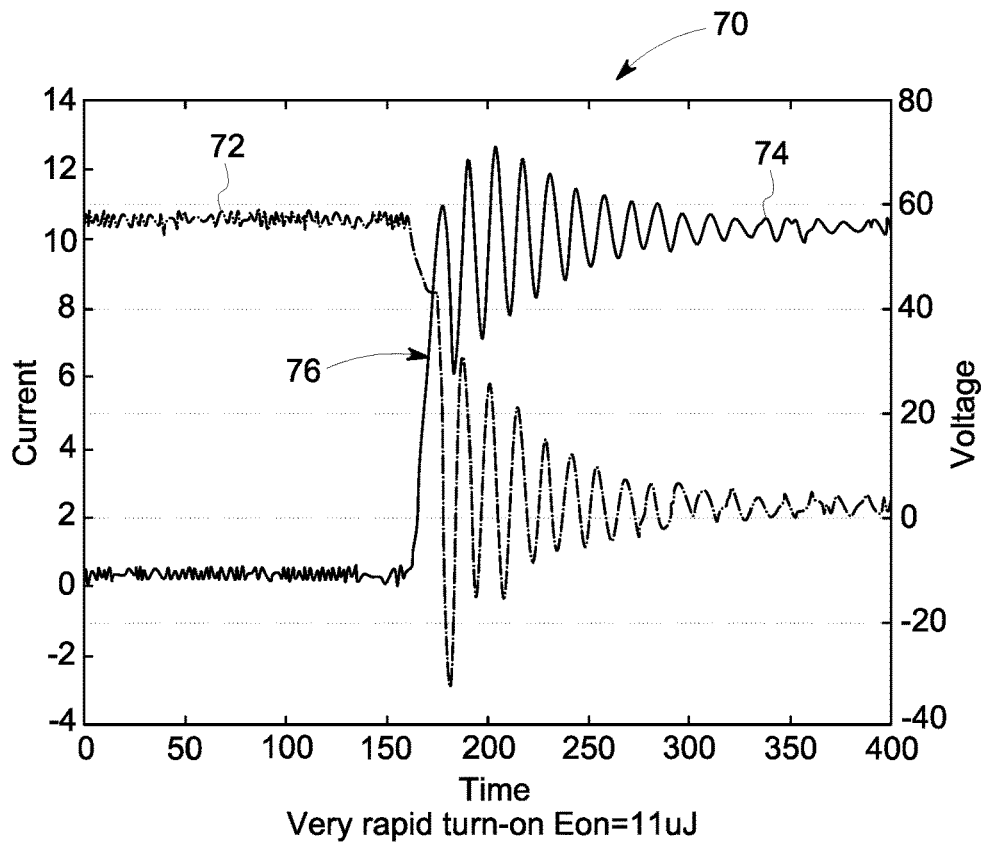
FIG. 4A is a graph depicting current and voltage outputs generated during a switching simulation that involved a rapid turn-on operational scheme, in accordance with aspects of the present approach.
Figure 4B:
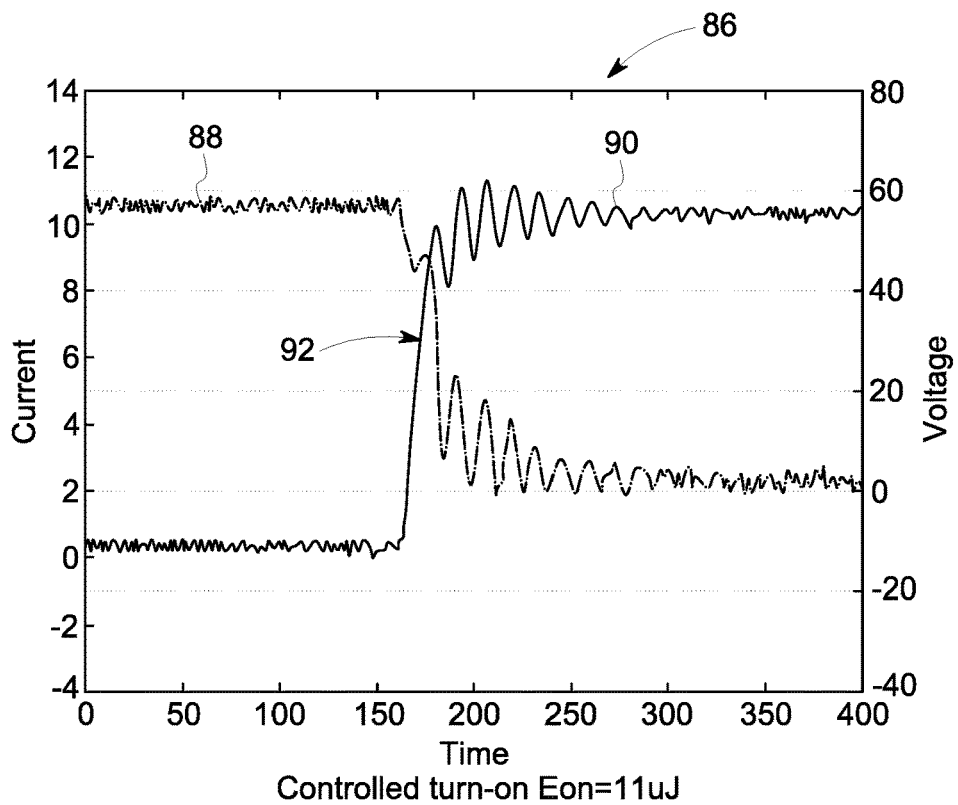
FIG. 4B is a graph depicting current and voltage outputs generated during a switching simulation that involved a controlled turn-on operational scheme that uses at least in part the auxiliary control circuit of FIG. 3, in accordance with aspects of the present approach.
Figure 4C:
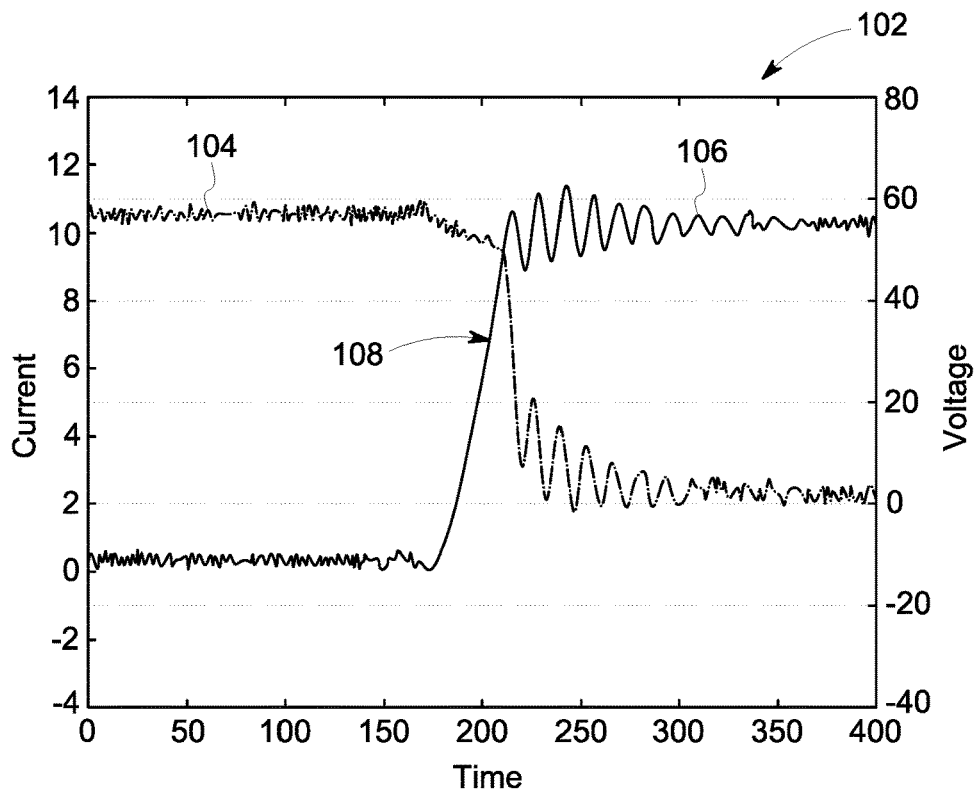
FIG. 4C is a graph depicting current and voltage outputs generated during a switching simulation that involved a slow turn-on operational scheme, in accordance with aspects of the present approach.

FIG. 4A-4C are graphs depicting voltages and currents associated with differing switching methods used to turn-on the MOSFET device 10. FIG. 4A is a graph 70 depicting a simulated voltage signal 72 output and a simulated current signal 74 output when driving the MOSFET device 10 without using the auxiliary control circuit 44. In this example, the MOSFET device 10 is driven using a rapid turn-on operational scheme that attempts to mimic an instantaneous switching operation where the MOSFET device 10 instantaneously turns-on with minimal losses. In the rapid turn-on operational scheme, the resistance value of the resistor 16 is selected to be as small of a resistance value as feasible and the MOSFET device 10 is driven using a driving voltage suitable for fast switching. Losses due at least in part to the time spent by the MOSFET device 10 operating in the Miller plateau 32 region equal about 11 microjoules (µJ). Despite the contribution to the loss levels being relatively low, the outputs actually experience a large amount of ringing (e.g., ringing generally indicated by arrow 76). In general, the more the voltage signal 72 and/or the current signal 74 switch back and forth (e.g., from the ringing), the more loss is experienced by the circuit 8.

The ringing depicted in the graph 70 is large relative to the ringing depicted in FIG. 4B. FIG. 4B is a graph 86 depicting a simulated voltage signal 88 output and a simulated current signal 90 output when driving the MOSFET device 10 using the auxiliary control circuit 44. In this example, the MOSFET device 10 is systematically driven through its various operational regions such that ringing and time spent in the Miller plateau 32 is minimized. In addition, as described above, the auxiliary control circuit 44 is also designed to compensate for parasitics in the circuit 8 and/or associated with the MOSFET device 10. While losses are maintained at a level generally equal to the losses of the graph 70 (e.g., 11 µJ), the ringing of the voltage signal 88 and the ringing of the current signal 90 (e.g., ringing generally indicated by arrow 92) is reduced. Thus, driving the MOSFET device 10 using the auxiliary control circuit 44 may reduce ringing as well as maintain losses at a low level, providing an improvement over merely driving the MOSFET device 10 using a rapid turn-on operational scheme.

To help depict this, FIG. 4C is a graph 102 depicting a simulated voltage signal 104 output and a simulated current signal 106 output when driving the MOSFET device 10 without using the auxiliary control circuit 44. In this example, the MOSFET device 10 is driven using a slow turn-on operational scheme. When driving the MOSFET device 10 using the slow turn-on operational scheme, the voltage signal 104 is operated to rise slowly (e.g., indicated by arrow 108) in the MOSFET device 10 relative to the rise of the rapid turn-on operational scheme. The slow turn-on operational scheme causes the ringing of the voltage signal 104 and the ringing of the current signal 106 (e.g., ringing generally indicated by arrow 108) to be as low as the ringing depicted in FIG. 4B.

However, the low ringing levels comes with a tradeoff—the tradeoff being that the loss levels are higher relative to driving techniques using the auxiliary control circuit 44 (e.g., FIG. 4B) or the rapid turn-on operational scheme (e.g., FIG. 4A). Losses due at least in part to the time spent by the MOSFET device 10 operating in the Miller plateau 32 region equal about 18 µJ. 18 µJ is large relative to the losses by driving the MOSFET device 10 with the auxiliary control circuit 44 (e.g., FIG. 4B) or the rapid turn-on operational scheme (e.g., FIG. 4A). Thus, FIGS. 4A-4C show benefits associated with driving the MOSFET device 10 using the auxiliary control circuit 44. These benefits may include minimizing the total amount of loss caused by the MOSFET device 10 operating in the Miller plateau 32 region while reducing an amount of ringing caused by excitement of MOSFET device 10 and/or circuit 8 parasitics.

Figure 5:
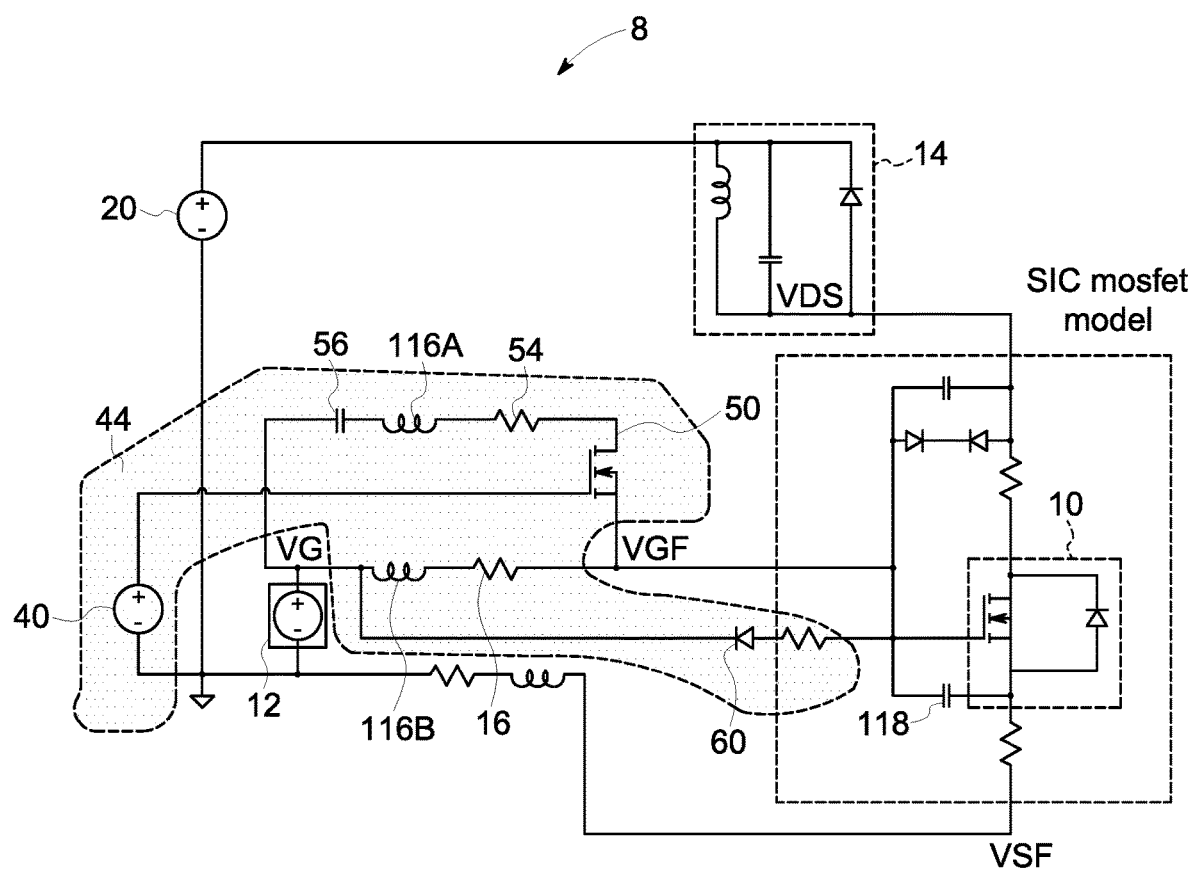
FIG. 5 is a circuit diagram of an embodiment of the MOSFET device of FIG. 3, in accordance with aspects of the present approach.

As described above, the auxiliary control circuit 44 may be designed to compensate for one or more parasitics in the circuit 8 and/or associated with the MOSFET device 10 that may cause a detectable amount of ringing during MOSFET device 10 switching when operated using the rapid turn-on operational scheme. To help illustrate, FIG. 5 depicts the circuit diagram of FIG. 3 including parasitics, such as one or more parasitic inductances 116 (e.g., 116A, 116B) and a Miller capacitance 118. It should be understood that although a particular number and type of parasitics are depicted, the auxiliary control circuit 44 may compensate for a variety of parasitics or non-uniform switching characteristics.

These parasitic inductances may affect MOSFET device 10 switching operations. Thus, using the auxiliary control circuit 44 to compensate for effects of the parasitic inductances may facilitate reducing the amount of ringing caused by excitement of the MOSFET device 10. For example, a parasitic inductance may be compensated by including a particular capacitance into the circuit 8. When the parasitic inductances are suitably compensated, ringing caused by switching of the MOSFET device 10 may be reduced.

In this way, different auxiliary control circuit 44 designs may provide advantageous operation for different applications. Different examples of auxiliary control circuit 44 embodiments are described below. It should be understood that any combination of the following circuits may be used in driving a load of the MOSFET device 10.

Figure 6:
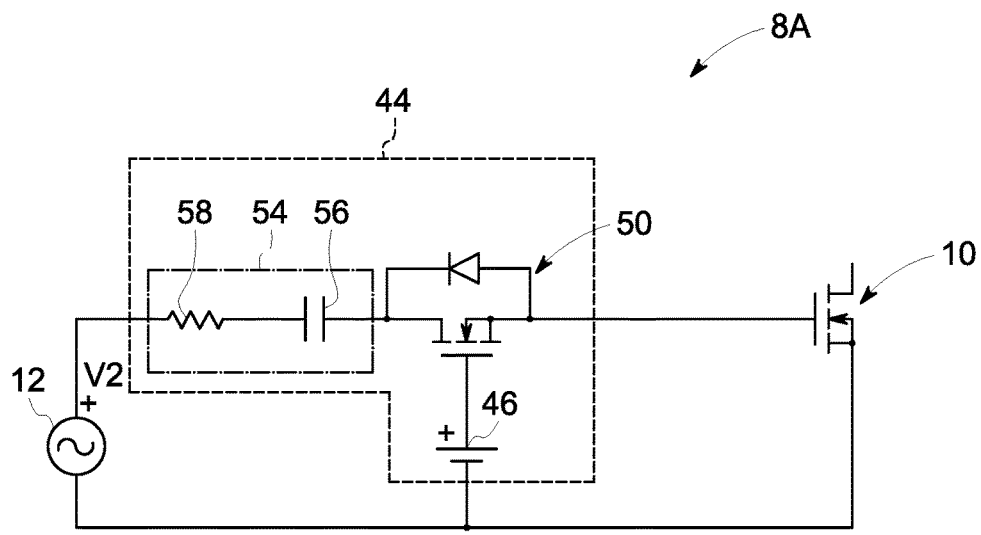
FIG. 6 is a circuit diagram of another embodiment of the MOSFET device of FIG. 3, in accordance with aspects of the present approach.

FIG. 6 is a circuit diagram depicting an embodiment of the circuit 8, circuit 8A, that uses an auxiliary control circuit 44 to drive the MOSFET device 10 without including the resistor 16 (e.g., gate resistor). The circuit 8A includes a basic variant of a turn-on control circuit (e.g., auxiliary control circuit 44). The MOSFET device 50 may act in one of three ways, that is, as a transconductance amplifier (e.g., a controlled current source), as a non-linear resistor, and/or as a cut-off switch. The timing control network impedance (e.g., overall impedance of the RC circuit 54, specific resistance and/or capacitance values of the resistor 58 and/or capacitor 56) regulates the duration for which the pulse is conducted through the channel. In this way, the RC circuit 54 is used for timing control and/or current shaping. The voltage source 46 may be a fixed or variable source. As described above, the gate driver 12 voltage is the main gate driver for the MOSFET device 10. The gate driver 12 voltage may be a pulse voltage source, an AC voltage source, an offset AC drive voltage, or any combination thereof. In this depicted arrangement, a body diode of the MOSFET device 50 acts to discharge the MOSFET device 10 gate once the signal at the gate driver 12 reverses. However, in some embodiments, a voltage controlled switch without the body diode may be used as the pass element. By modifying the impedance of the RC circuit 54, the shape and/or duration of the current pulse transmitted to the MOSFET device 10 from the gate driver 12 may be shaped (e.g., current shaping to generate a shaped current) to permit suitable driving of the MOSFET device 10. Through using the shaped current, the MOSFET device 10 may be driven into different operational regions and thus may be operated to behave differently in different operational regions based on the value of driving signal applied to the gate of the MOSFET device 10.

Figure 7:
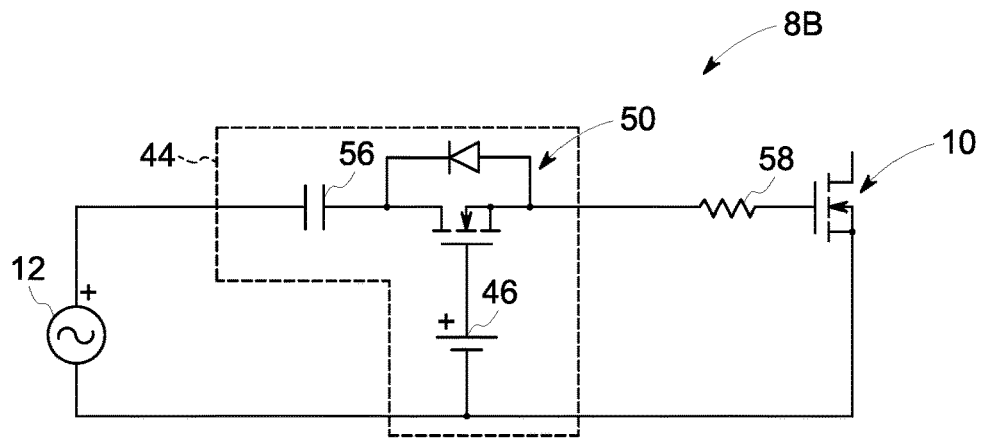
FIG. 7 is a circuit diagram of an embodiment of the MOSFET device of FIG. 3, in accordance with aspects of the present approach.

FIG. 7 is a circuit diagram depicting another embodiment of the circuit 8, circuit 8B, that uses the auxiliary control circuit 44 to drive the MOSFET device 10 without including the resistor 16 (e.g., gate resistor) and modifying the resistor 58. In circuit 8B, the resistor 58 is used as a source feedback resistor. To phrase differently, the resistor 58 is placed in series with the series pass MOSFET device 50 to form a source feedback amplifier. The capacitor 56 and the resistor 58 may continue to be used to provide timing control and/or current shaping such that the MOSFET device 10 is driven into different operational regions.

Figure 8:
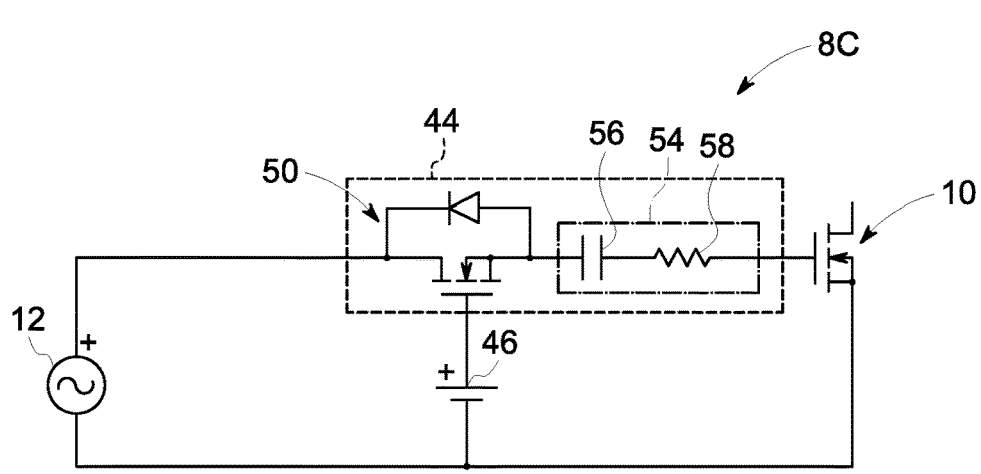
FIG. 8 is a circuit diagram of another embodiment of the MOSFET device of FIG. 3, in accordance with aspects of the present approach.

FIG. 8 is a circuit diagram depicting another embodiment of the circuit 8, circuit 8C, that uses the auxiliary control circuit 44 to drive the MOSFET device 10 without including resistor 16 (e.g., gate resistor). The circuit 8C includes the RC circuit 54 directly coupled to the gate of the MOSFET device 10. In this way, the RC circuit 54 provides timing control and/or current shaping, as previously discussed, in addition to acting like a non-linear source feedback resistor. The pass element MOSFET device 50 may benefit from including the RC circuit 54 as a non-linear source feedback resistor.

As described above, the resistance value of the resistor 58 and the capacitance value of the capacitor 56 are used to shape the response of the MOSFET device 10. Thus, the time constant defined by the impedances of the auxiliary control circuit 44 may predefine (e.g., before actual driving of the MOSFET device 10) a driving pattern to be used to drive the MOSFET device 10. The preprogrammed auxiliary control circuits 44 may thus facilitate precise switching operations associated with driving the MOSFET device 10. Additionally or alternatively, one or more auxiliary control circuits (e.g., auxiliary control circuit 44) may be used in parallel to drive the MOSFET device 10 through the one or more operational regions.

Figure 9:
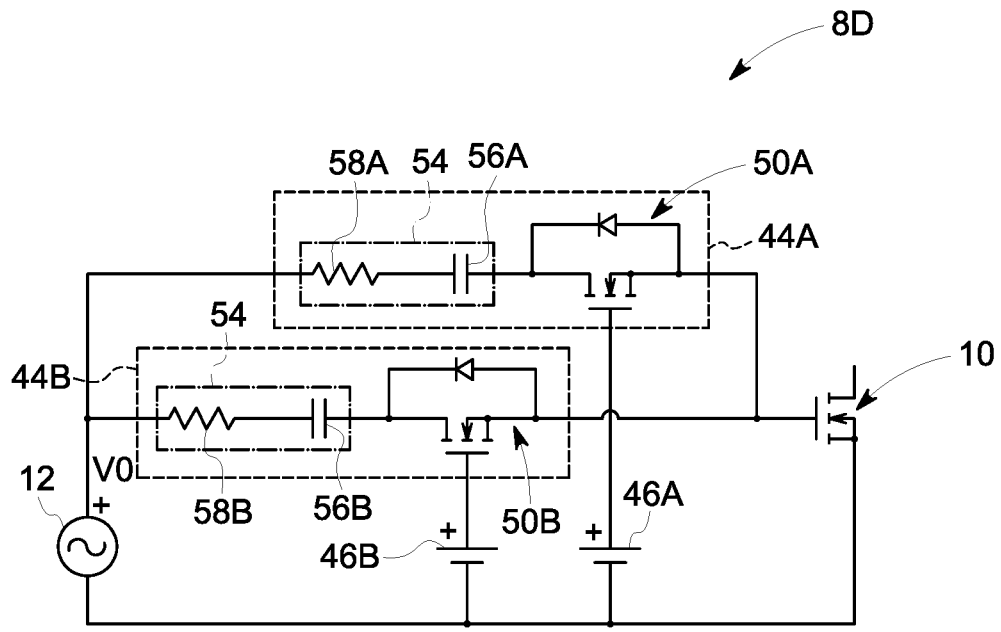
FIG. 9 is a circuit diagram of another embodiment of the MOSFET device of FIG. 3, in accordance with aspects of the present approach.

For example, FIG. 9 is a circuit diagram depicting an embodiment of the circuit 8, circuit 8D, that uses one or more auxiliary control circuits 44 (e.g., auxiliary control circuit 44A, auxiliary control circuit 44B) coupled in parallel to drive the MOSFET device 10. Each of the auxiliary control circuits 44 may be sequenced in time and output at different levels. As described above, each of the depicted auxiliary control circuits 44 of the different branches has a predefined (e.g., preset, predetermined) operation based at least in part on the time constant associated with one or more resistors 58 (e.g., resistor 58A, resistor 58B) and/or one or more capacitors 56 (e.g., capacitor 56A, capacitor 56B) of the respective auxiliary control circuits 44. In this way, each of the branches (e.g., each of the auxiliary control circuits 44) may respectively use different variants of the auxiliary control circuits 44 in combination with each other. In this way, the first auxiliary control circuit 44A may include the RC circuit 54 as depicted in FIG. 6 while the second auxiliary control circuit 44B may include circuitry as depicted in FIG. 7.

To perform switching operations, the auxiliary control circuits 44 may be individually activated using different voltage control signals outputted by voltage sources 46 (e.g., voltage source 46A, voltage source 46B) and used to drive the MOSFET device 10 at different times. Using the preprogrammed auxiliary control circuits 44 may enable faster switching of the MOSFETs (e.g., MOSFET device 10) relative to existing driving techniques. In addition, driving the MOSFET device 10 with multiple auxiliary control circuits 44 may enable distinct steps of a single switching operation to be preprogrammed into respective auxiliary control circuits 44. In this way, one or more impedance values may be selected within each of the auxiliary control circuits 44 to correspond to a particular switching step or driving operation, where sequential activation of the respective auxiliary control circuits 44 may guide the MOSFET device 10 to switch in an improved manner.

Figure 10:
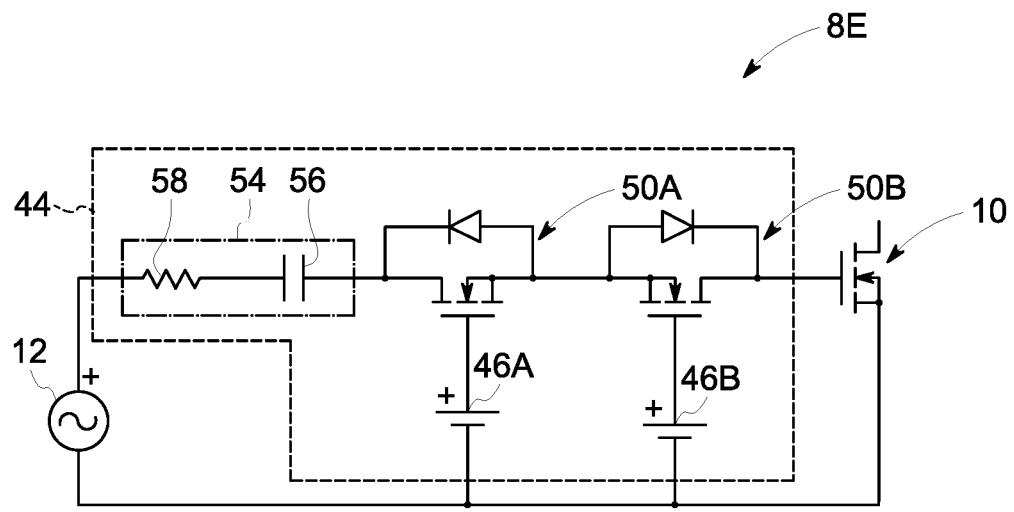
FIG. 10 is a circuit diagram of another embodiment of the MOSFET device of FIG. 3, in accordance with aspects of the present approach.

FIG. 10 is a circuit diagram depicting another embodiment of the circuit 8, circuit 8E, that uses the auxiliary control circuit 44 to drive the MOSFET device 10 without including resistor 16 (e.g., gate resistor). Using the depicted arrangement, the auxiliary control circuit 44 provides bidirectional control to the MOSFET device 10. In the previous embodiments, in particular circuit 8A of FIG. 6, the series pass MOSFET device 50 discharges the MOSFET device 10 gate through the body diode of the MOSFET device 50. To prevent this operation, a series switch (e.g., MOSFET device 50B) in an anti-series arrangement may be used. The anti-series arrangement is provided by the opposing body diodes and coupled sources of the MOSFET device 50B and of the MOSFET device 50A. The RC circuit 54 may continue to be used for timing control and/or current shaping. In some embodiments, the MOSFET device 50B may be replaced by a diode for uncontrolled blocking in the reverse direction. It should be appreciated that any of the described embodiments may be combined with the bidirectional control variant discussed in FIG. 10.

Figure 11:
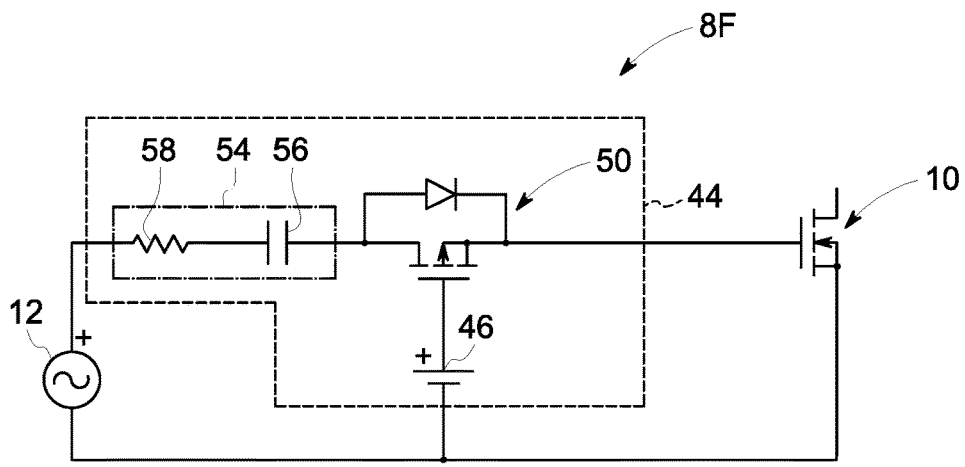
FIG. 11 is a circuit diagram of another embodiment of the MOSFET device of FIG. 3, in accordance with aspects of the present approach.

The above-described circuitry has been generally discussed in terms of turn-on operational control of the MOSFET device 10. However, the above-described circuitry may also be applied and used for turn-off operational control of the MOSFET device 10. For example, FIG. 11 is a circuit diagram depicting another embodiment of the circuit 8, circuit 8F, that uses the auxiliary control circuit 44 to drive the MOSFET device 10 without including resistor 16 (e.g., gate resistor). Furthermore, the circuit 8F uses a P-channel MOSFET as the MOSFET device 50, differing from using the N-channel MOSFET as the MOSFET device 50 described above.

In contrast to the turn-on circuitry described above, the turn-off auxiliary control circuit 44 is used to control a rate of change of the drain-source voltage, $$\left(\text{e.g., } \frac{dv_{ds}(t)}{dt}\right),$$

a peak voltage, as well as ringing harmonics in voltage waveforms generated during the turn-off operations. This may permit sympathetic control of drain current during the turn-off operations, where sympathetic control refers to indirect control of or control based on induced properties (e.g., a voltage causes a current through a resistor such that a change in the voltage sympathetically changes the current).

Describing operation of the circuit 8F, the voltage source 46 sets the gate voltage of the MOSFET device 50. The gate of the MOSFET device 10 is at the voltage of the source of the MOSFET device 50 (e.g., the series pass element). When the MOSFET device 50 is operated to conduct by the voltage source 46 and when the voltage output from the gate driver (e.g., a pulse voltage, AC voltage, offset AC drive voltage, or the like) is low, the gate voltage of the MOSFET device 10 decreases. At some point, the MOSFET device 50 in combination with the RC circuit 54 (e.g., timing controlling and/or current shaping impedance) shapes and cuts off current associated with the MOSFET device 10.

Figure 12:
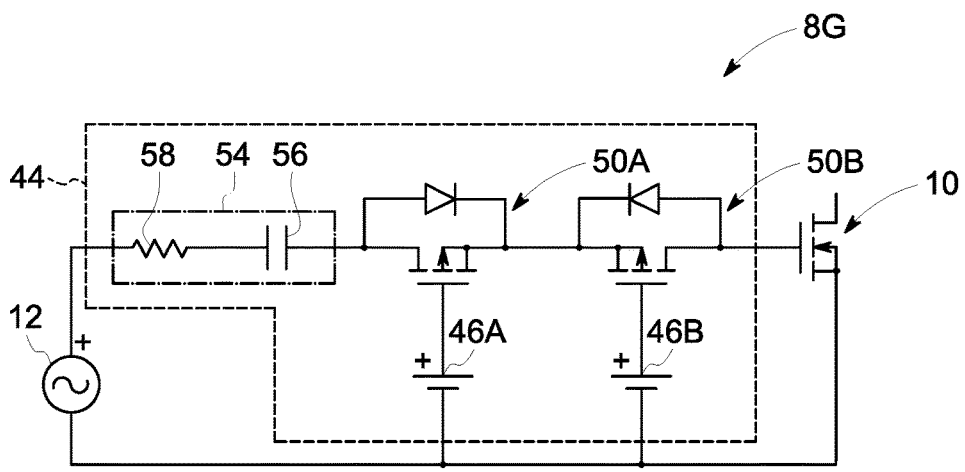
FIG. 12 is a circuit diagram of another embodiment of the MOSFET device of FIG. 3, in accordance with aspects of the present approach.

FIG. 12 is a circuit diagram depicting another embodiment of the circuit 8, circuit 8G, which features turn-off operation control circuitry of the bidirectional control variant. In this way, the circuit 8G is also an embodiment of the circuit 8E. The bidirectional turn-off operation control circuitry of the circuit 8G includes many similar elements to the bidirectional turn-on control circuitry of the circuit 8E. However, instead of including N-channel MOSFET devices as the MOSFET devices 50 (e.g., MOSFET device 50A, MOSFET device 50B), the circuit 8G features P-channel MOSFET devices as the MOSFET devices 50. In this way, the MOSFET device 50B is used as a series switch in an anti-series arrangement. The anti-series arrangement is provided by the opposing body diodes and coupled sources of the MOSFET device 50B and of the MOSFET device 50A. The RC circuit 54 may continue to be used for timing control and/or current shaping. In some embodiments, the MOSFET device 50B may be replaced by a diode for uncontrolled blocking in the reverse direction. It should be appreciated that any of the described embodiments may be combined with the bidirectional control variant discussed in FIG. 10.

Figure 13:
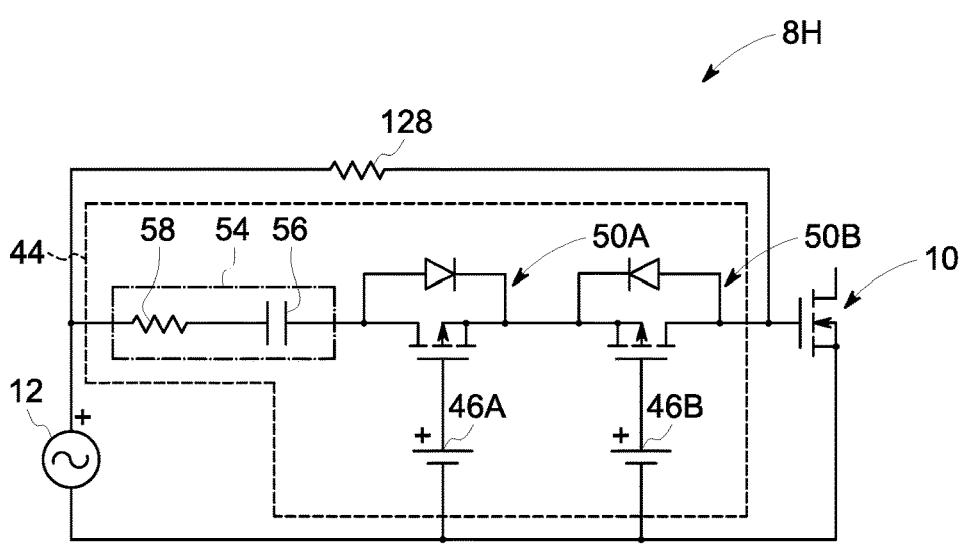
FIG. 13 is a circuit diagram of another embodiment of the MOSFET device of FIG. 3, in accordance with aspects of the present approach.

FIG. 13 is a circuit diagram depicting another embodiment of the circuit 8G, circuit 8H, which features a parallel impedance branch (e.g., including resistor 128). It is noted that although depicted with respect to the circuit 8G, it should be understood that the parallel impedance branch may be included with any of the described circuits. For example, FIG. 3 generally depicts the parallel impedance branch (e.g., resistor 16) as part of the non-bidirectional turn-on control circuitry. Including the parallel impedance branch may facilitate increasing control of switching of the MOSFET device 10, as described above.

Figure 14:
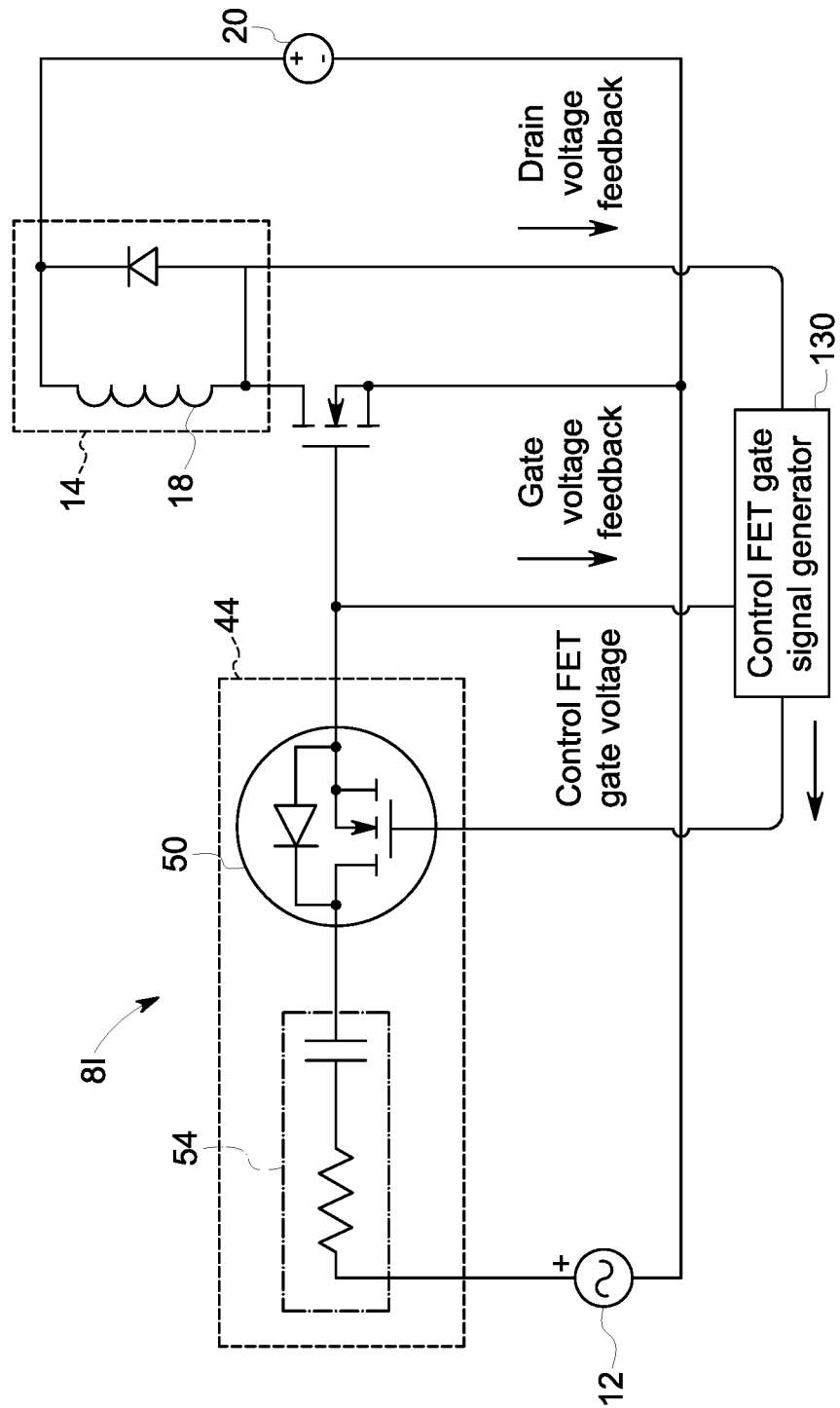
FIG. 14 is a circuit diagram of another embodiment of the MOSFET device of FIG. 3 as used in a control loop or feedback loop, in accordance with aspects of the present approach.

In some embodiments, one or more of the auxiliary control circuits 44 may be used as part of a control loop or feedback loop. FIG. 14 is a circuit diagram depicting another embodiment of the circuit 8A, circuit 8I, which features the MOSFET device 10 (e.g., including resistor 128), the MOSFET device 8, the RC circuit 54, the gate driver 12 supply voltage, and a control signal generator 130 coupled together to form a control loop or feedback loop circuit. It is noted that although depicted with respect to the turn-on circuit variants (e.g., having the N-channel MOSFET 50), it should be understood that any of the described circuits may be used in a similar control loop or feedback loop. Although depicted as a feedback control loop, it should be understood that signals may be received by the control signal generator 130 as part of any suitable control scheme, such as but not limited to an open loop control scheme, a feed forward control scheme, a feedback control scheme, or any suitable combination of those listed schemes.

During operation, a parameter may be sensed of a load (e.g., load inductance model 14) and/or an output (e.g., generally a drain current or drain voltage) from the MOSFET device 10 may be received by the control signal generator 130. The signal resulting from the sensing of the parameter may be used to change operations of the one or more auxiliary control circuits 44, as a way to change one or more operations or outputs of the MOSFET device 10. For example, a drain-source voltage output from MOSFET device 50, a drain voltage feedback output from the MOSFET device 10, a gate voltage feedback output from the MOSFET device, a suitable parameter from the load inductance model 14, or other suitable parameter, may be sensed and used to operate the auxiliary control circuit 44 such that a gate-source voltage output from the MOSFET device 10 may be maintained at a particular peak voltage value or at a particular rate of change. In some embodiments, the MOSFET device 10 is driven to operate in each of its switching regions (or a sub-set of its switching regions) based at least in part on the control signal generator 130 selectively activating and deactivating different MOSFET devices 50 at different times.

In addition to reductions to switching losses, benefits of driving the MOSFET device 10 using the auxiliary control circuit 44 also include reduced electro-magnetic interferences (EMI) and increased control over electrical signal peaks that happen during MOSFET switching operations. To elaborate, MOSFET devices (e.g., MOSFET device 10) may be used as a switch in circuitry and/or devices sensitive to high (e.g., high relative to expected, average, or normal operation) voltages, or other electrical signals. In these embodiments, special care may be taken to protect the rest of the device from the peak outputs from the MOSFET devices during the switching operations. One way to manage this may be to program one or more auxiliary control circuits 44 (e.g., via at least the respective time constants of the respective auxiliary control circuits 44) to drive the MOSFET devices in such a way as to not output too high of a level of voltages or currents.

Other possible enhancements to the techniques described above include, for example sensing a peak current associated with ringing (e.g., relative maximum current associated with the portion of the current corresponding to ringing) and adjusting control of the MOSFET device 50 in response to the sensed peak current. Adjustments may include operating the MOSFET device 50 such that the rate of rise of the current associated with the MOSFET device 10 (e.g., the peak current measured at a later time) is changed or operating the MOSFET device 50 to change a rate of turn-on of the MOSFET device 10. Any suitable parameter may be sensed and used to control operation of the MOSFET device 50 and/or one or more of the auxiliary control circuits 44, for example, sensing of noise currents or the like. Furthermore, in less sensitive environments, operation of the MOSFET device 50 and/or one or more of the auxiliary control circuits 44 may be based at least in part on dual consideration to losses and electro-magnetic interferences. Furthermore, in some embodiments, the additional auxiliary control circuits 44 may be programmed to facilitate switching through the various operational regions of the MOSFET device 10 in addition to being programmed (or include additional auxiliary control circuits) to facilitate switching through regions having different threshold voltages or other thresholds and/or different timing parameters. The control signal generator 130 may additionally or alternatively be used to balance electromagnetic emissions, regulating change in voltage outputs (e.g., $\frac{dv(t)}{dt}$), regulating change in current outputs (e.g., $\frac{di(t)}{dt}$), peak voltage(s), peak current(s), or the like.

Additionally or alternatively, the RC circuit 54 described above may be used with other passive elements, such as inductors, to tune the auxiliary control circuit 44 to higher orders. The auxiliary control circuit 44 may also be used to control the rate of change of the current (e.g., $\frac{di(t)}{dt}$), the peak current value, ringing harmonics, or the like, associated with current waveforms transmitted to the MOSFET device 10 during turn-on operations. This may also permit sympathetic control of drain-source voltages of the MOSFET device 10 during the turn-on operations. Furthermore, the techniques described herein may be used with an insulated-gate bipolar transistor (IGBT) or any other suitable switching devices.

Figure 15:
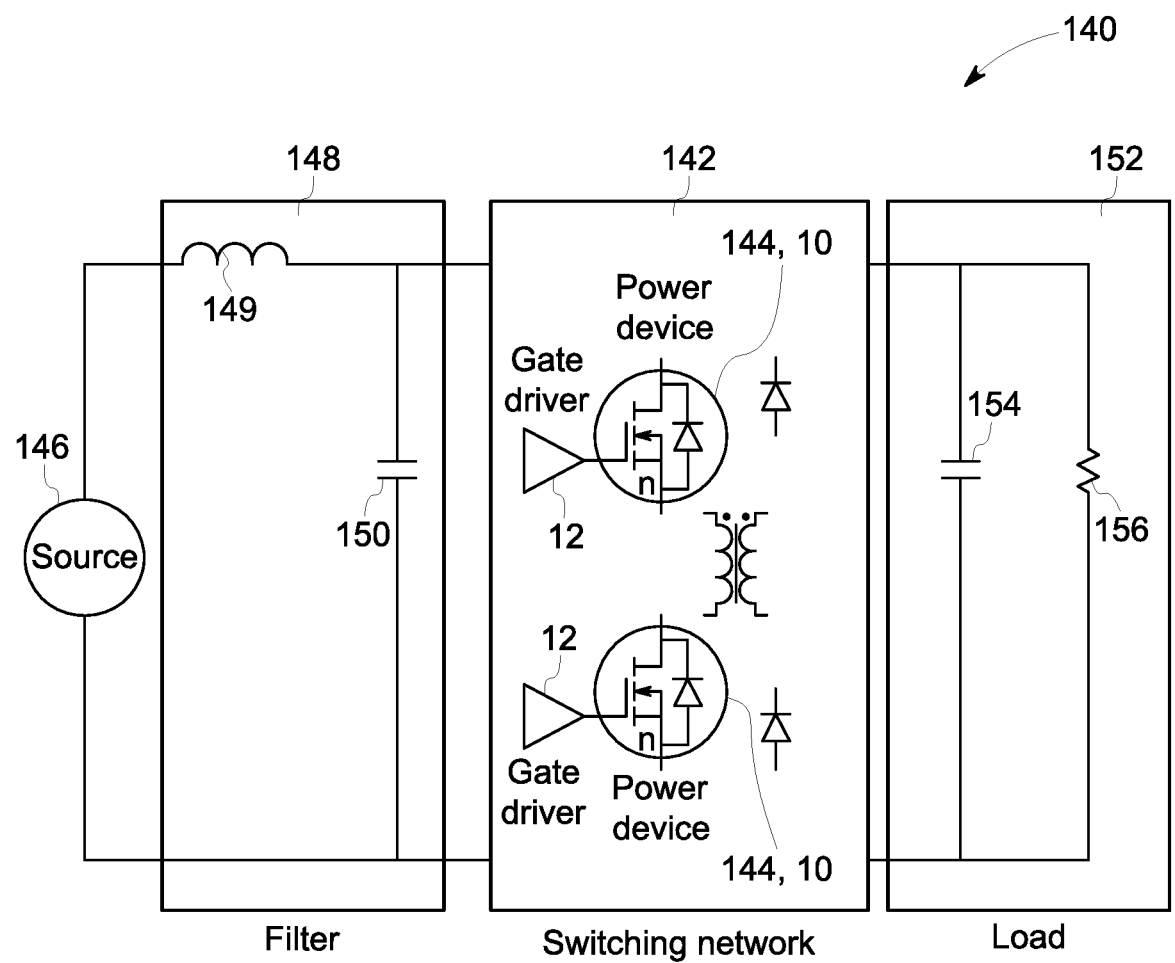
FIG. 15 is a block diagram of an example power converter system implementation of the MOSFET device of FIG. 3 and/or any of the embodiments described herein, in accordance with aspects of the present approach.

The circuitry described above may be included within a switching system. FIG. 15 is a block diagram of an example use of the circuit 8 and/or any of the embodiments of the circuit 8 described herein. The above-described circuitry is depicted as used in a power converter system 140. In general, the power converter system 140 may include the circuit 8 within its switching network 142, such as between the switch gate driver 12 and a power device 144 (e.g., a semiconductor power switching device, such as the MOSFET device 10). This placement enables the auxiliary control circuit 44 of the circuit 8, which may be included within a larger control loop or feedback loop, to selectively guide the semiconductor power device through its various switching regions, reducing losses and permitting precise driving of the semiconductor power device. As described above, the current supplied to the power device 144 may be shaped by components of the circuit 8.

The gate drivers 12 may be supplied by a source 146 coupled to a filter network 148. The filter network 148 may include any suitable filtering components, such as an inductor 149 (L) and/or a capacitor 150 (C). In this depicted example, the filter network 148 is an LC filter that may be tuned for the particular switching system application. The source 146 may be any suitable voltage source to supply the filter network 148.

Within the switching network 142, the specific electrical couplings between the various components affect the output transmitted to a load 152. The load 152 may be modelled similar to the load inductance model 14 but may include a particular value of a capacitor 154 and/or a particular value of a resistor 156 in addition to or in alternative of components of the load inductance model 14. It is noted that each of the depicted capacitors, resistors, and/or inductors may be representative of an overall capacitance, an overall resistance, and/or an overall inductance value. The gate drivers 12 may operate together to cause the switching network 142 to supply a particularly configured voltage to the load 152 based on the frequency of the switching performed by the power devices 144.

Technical effects of this disclosure include designs and methods of providing an auxiliary control circuit that facilitates switching operations of a first metal-oxide-semiconductor field-effect transistor (MOSFET). In particular, the disclosed auxiliary control circuit includes a time component, for example, a RC circuit, coupled to a second MOSFET that activates in response to a control signal, yielding a selectable control circuit that is able to provide a programmed boost signal for a predetermined amount of time (e.g., a shaped current) in response to the second MOSFET being activated. Computing circuitry associated with the auxiliary control circuit may sense one or more parameters of the first MOSFET and determine one or more adjustments to perform to a time constant or suitable operation of the auxiliary control circuit to suitably compensate for output variations from the first MOSFET (e.g., as part of a control loop or feedback loop). Accordingly, the auxiliary control circuit may facilitate providing improved switching of the first MOSFET.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A circuit, comprising:
a first switching device coupled to a load;
a first voltage source configured to generate an electrical signal at a voltage level at least equal to a threshold voltage of the first switching device;
a second switching device between the first switching device and the first voltage source, wherein the second switching device is configured to provide a shaped current to the first switching device in response to a control signal, wherein the shaped current is generated based at least in part on the electrical signal generated by the first voltage source, and wherein the shaped current actuates the first switching device; and
a resistor-capacitor (RC) circuit configured to shape the shaped current by changing a duration of the electrical signal, an amplitude of the electrical signal, a shape of the electrical signal, or any combination thereof.

2. The circuit of claim 1, comprising a first impedance between the first voltage source and the second switching device and a second impedance between the second switching device and the first switching device.

3. The circuit of claim 1, comprising a control signal generator configured to provide the control signal to the second switching device based at least in part on one or more feedback signals from the first switching device, the second switching device, the load, or any combination thereof, as part of a control loop.

4. The circuit of claim 1, wherein the second switching device comprises a current-controlled switch, a voltage-controlled switch, a metal-oxide-semiconductor field-effect transistor (MOSFET) device, an insulated-gate bipolar transistors (IGBTs), a bipolar transistors (BJTs), or any combination thereof.

5. The circuit of claim 1, wherein the second switching device is configured as an N-channel metal-oxide-semiconductor field-effect transistor (MOSFET) device, and wherein the resistor-capacitor (RC) circuit is between the second switching device and the first voltage source.

6. The circuit of claim 1, wherein the second switching device is configured as an N-channel metal-oxide-semiconductor field-effect transistor (MOSFET) device, and wherein the resistor-capacitor (RC) circuit is between the second switching device and the first switching device.

7. The circuit of claim 1, wherein the second switching device is configured as a P-channel metal-oxide-semiconductor field-effect transistor (MOSFET) device, and wherein the resistor-capacitor (RC) circuit is between the second switching device and the first voltage source.

8. The circuit of claim 1, wherein the second switching device is configured as a P-channel metal-oxide-semiconductor field-effect transistor (MOSFET) device, and wherein the resistor-capacitor (RC) circuit is between the second switching device and the first switching device.

9. The circuit of claim 1, comprising an additional resistor-capacitor (RC) circuit and a third switching device, wherein the additional resistor-capacitor (RC) circuit is between the third switching device and the first voltage source, wherein the third switching device is coupled to the first switching device and the second switching device, and wherein separate control signals are selectively transmitted to the second switching device and the third switching device to control operation of the first switching device.

10. The circuit of claim 1, comprising an additional resistor-capacitor (RC) circuit and a third switching device, wherein the additional resistor-capacitor (RC) circuit is between the third switching device and the first switching device, wherein the third switching device is coupled to the first switching device and the second switching device, and wherein separate control signals are selectively transmitted to the second switching device and the third switching device to control operation of the first switching device.

11. The circuit of claim 1, comprising a third switching device configured in anti-series relative to the second switching device, and wherein the third switching device is between the second switching device and the first switching device.

12. The circuit of claim 11, comprising an additional resistor, wherein the additional resistor is between the first switching device and the first voltage source, and wherein the additional resistor is coupled to the third switching device.

13. The circuit of claim 12, wherein the resistor-capacitor (RC) circuit is between the third switching device and the first switching device, and wherein the resistor-capacitor (RC) circuit is shared by the third switching device and the second switching device.

14. A power converter system, comprising:
a load configured to operate based at least in part on a supplied electrical signal; and
a switching network configured to selectively enable and disable the supplied electrical signal based at least in part on a control scheme associated with operation of the load, wherein the switching network comprises:
a gate driver;
a power device configured to enable in response to a control signal generated by the gate driver based on the control scheme, wherein enabling of the power device is configured to selectively enable and disable the supplied electrical signal; and
an auxiliary control circuit between the gate driver and the power device, wherein the auxiliary control circuit is configured to shape the control signal before the control signal is applied to the power device, wherein the auxiliary control circuit comprises a resistor-capacitor (RC) circuit configured to shape the control signal by changing a duration, amplitude, shape of the control signal, or any combination thereof, and wherein the auxiliary control circuit comprises a second switching device configured to selectively provide the control signal to the power device in response to an additional control signal output generated based on the control scheme associated with operation of the load.

15. The power converter system of claim 14, wherein the second switching device is configured as a turn-on control circuit comprising an N-channel metal-oxide-semiconductor field-effect transistor (MOSFET) device, and wherein the resistor-capacitor (RC) circuit is between the second switching device and the gate driver.

16. The power converter system of claim 14, wherein the second switching device is configured as a P-channel metal-oxide-semiconductor field-effect transistor (MOSFET) device, and wherein the resistor-capacitor (RC) circuit is between the second switching device and the power device.

17. The power converter system of claim 14, wherein the second switching device is configured as an N-channel metal-oxide-semiconductor field-effect transistor (MOSFET) device, and wherein the resistor-capacitor (RC) circuit is between the second switching device and the power device.

18. The power converter system of claim 14, wherein the resistor-capacitor (RC) circuit comprises:
a resistor between the second switching device and the gate driver; and
a capacitor between the second switching device and the power device, wherein the capacitor is configured to shape a current provided by the gate driver to generate the control signal.

19. The power converter system of claim 14, comprising one or more additional auxiliary control circuits coupled in parallel to the auxiliary control circuit, wherein each of the additional auxiliary control circuits and the auxiliary control circuit are simultaneously coupled to a gate of the power device.

20. An auxiliary control circuit, comprising:
a first switching device configured to enable in response to a control signal generated to control supply of a shaped current to a second switching device;
a first voltage source configured to generate the control signal, wherein the control signal comprises an electrical signal having a voltage level at least equal to a threshold voltage of the first switching device; and
one or more devices between the first switching device and a second voltage source, wherein the first switching device is configured to provide the shaped current to the second switching device in response to being enabled by the control signal, wherein the shaped current is generated based at least in part on the electrical signal generated by second voltage source and an impedance value of the one or more devices, wherein the shaped current actuates the first switching device, and wherein the one or more devices comprises one or more resistors, one or more capacitors, or any combination thereof.

21. The auxiliary control circuit of claim 20, wherein the first switching device is configured as an N-channel metal-oxide-semiconductor field-effect transistor (MOSFET) device or a P-channel metal-oxide-semiconductor field-effect transistor (MOSFET) device, and wherein at least one resistor or capacitor is between the first switching device and the second switching device.

22. An auxiliary control circuit, comprising:
 a first switching device configured to enable in response to a control signal generated to control supply of a shaped current to a second switching device;
 a first voltage source configured to generate the control signal, wherein the control signal comprises an electrical signal having a voltage level at least equal to a threshold voltage of the first switching device; and
 one or more devices between the first switching device and a second voltage source, wherein the first switching device is configured to provide the shaped current to the second switching device in response to being enabled by the control signal, wherein the shaped current is generated based at least in part on the electrical signal generated by second voltage source and an impedance value of the one or more devices, wherein the shaped current actuates the first switching device, wherein the one or more devices comprises one or more resistors, one or more capacitors, or any combination thereof, and wherein at least one resistor or capacitor is between the first switching device and the second switching device.

\* \* \* \* \*